United States Patent
Lai et al.

(10) Patent No.: US 7,600,206 B2
(45) Date of Patent: Oct. 6, 2009

(54) METHOD OF ESTIMATING THE SIGNAL DELAY IN A VLSI CIRCUIT

(75) Inventors: Ming-Hong Lai, Taichung (TW); Chao-Hsuan Hsu, Toufen Township, Miaoli County (TW); Chia-Chi Chu, Tao-Yuan (TW); Wu-Shiung Feng, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 245 days.

(21) Appl. No.: 11/733,030

(22) Filed: Apr. 9, 2007

(65) Prior Publication Data
US 2008/0250369 A1 Oct. 9, 2008

(51) Int. Cl.
*G06F 17/50* (2006.01)

(52) U.S. Cl. ............... 716/6; 716/4; 716/5; 703/19

(58) Field of Classification Search ............... 716/1–6, 716/18; 703/13–16, 19
See application file for complete search history.

(56) References Cited

U.S. PATENT DOCUMENTS

| 6,014,510 A * | 1/2000 | Burks et al. ............... 703/19 |
| 6,519,748 B2 * | 2/2003 | Sakamoto ............... 716/6 |
| 2002/0016950 A1 * | 2/2002 | Sakamoto ............... 716/6 |
| 2007/0266357 A1 * | 11/2007 | Kimata et al. ............... 716/6 |

* cited by examiner

*Primary Examiner*—Paul Dinh
(74) *Attorney, Agent, or Firm*—Alan Kamrath; Kamrath & Associates PA (57) ABSTRACT

A method estimates the signal delay in a VLSI circuit and accurately estimates the delay and conversion time of a transmission signal in the circuit in order to prevent a designer of the VLSI circuit from erroneously judging the logic made by the designed circuit.

4 Claims, 7 Drawing Sheets

METHOD OF ESTIMATING THE SIGNAL DELAY IN A VLSI CIRCUIT

BACKGROUND OF THE INVENTION

1. Field of the Invention

This invention relates to a method of estimating the signal delay in a VLSI circuit and particularly to a method of feasibly fast calculating the delay and conversion time of a transmission signal in the VLSI circuit in order to prevent the erroneous logic judgment of a circuit design.

2. Description of Related Art

In a conventional technology, a method estimates the signal delay in an interconnection circuit by fixing the structure, number of components, and capacitance function of an interconnection network, but the technology could not be widely used in structures of different interconnection networks.

In a conventional technology that broke through the limit to the structure of a fixed interconnection RC network, a method feasibly estimates the transmission signal delay caused by components in two circuits, but it could not be used for calculating the total signal delay from input to output in a VLSI circuit.

Consequently, because of the technical defects described above and through wholehearted experience and research, the present invention was developed to effectively improve the defects described above.

SUMMARY OF THE INVENTION

This invention relates to a method of estimating the signal delay in a VLSI circuit and accurately estimating the delay and conversion time of a transmission signal in the circuit in order to prevent a designer of the VLSI circuit from erroneously judging the logic made by the designed circuit.

In a process of the algorithm of the clock signal delay in this invention, at first, calculation of the parasitic parameters, signal conversion time, logic cell library, and circuit architecture in an inputted file-based interconnection circuit is made for the voltage moment at each node and the current moment in a branch line of the specified interconnection circuit. Then, what is obtained is applied to a reduced model for forming a die original circuit, in which the reduced model retains passivity and stability and in which the operation conditions of its input and output nodes are identical to those of the original system. Finally, a signal time domain is simulated, and, then, the equivalent capacitance is calculated so that drive logic gate delay time, interconnection circuit delay time, and output signal conversion time are analyzed.

DETAILED DESCRIPTION OF THE PREFERRED EMBODIMENTS

Now, the present invention will be described more specifically with reference to the following embodiments. It is to be noted that the following descriptions of the preferred embodiments of this invention are presented herein for purpose of illustration and description only; it is not intended to be exhaustive or to be limited to the precise form disclosed.

Figure 1:
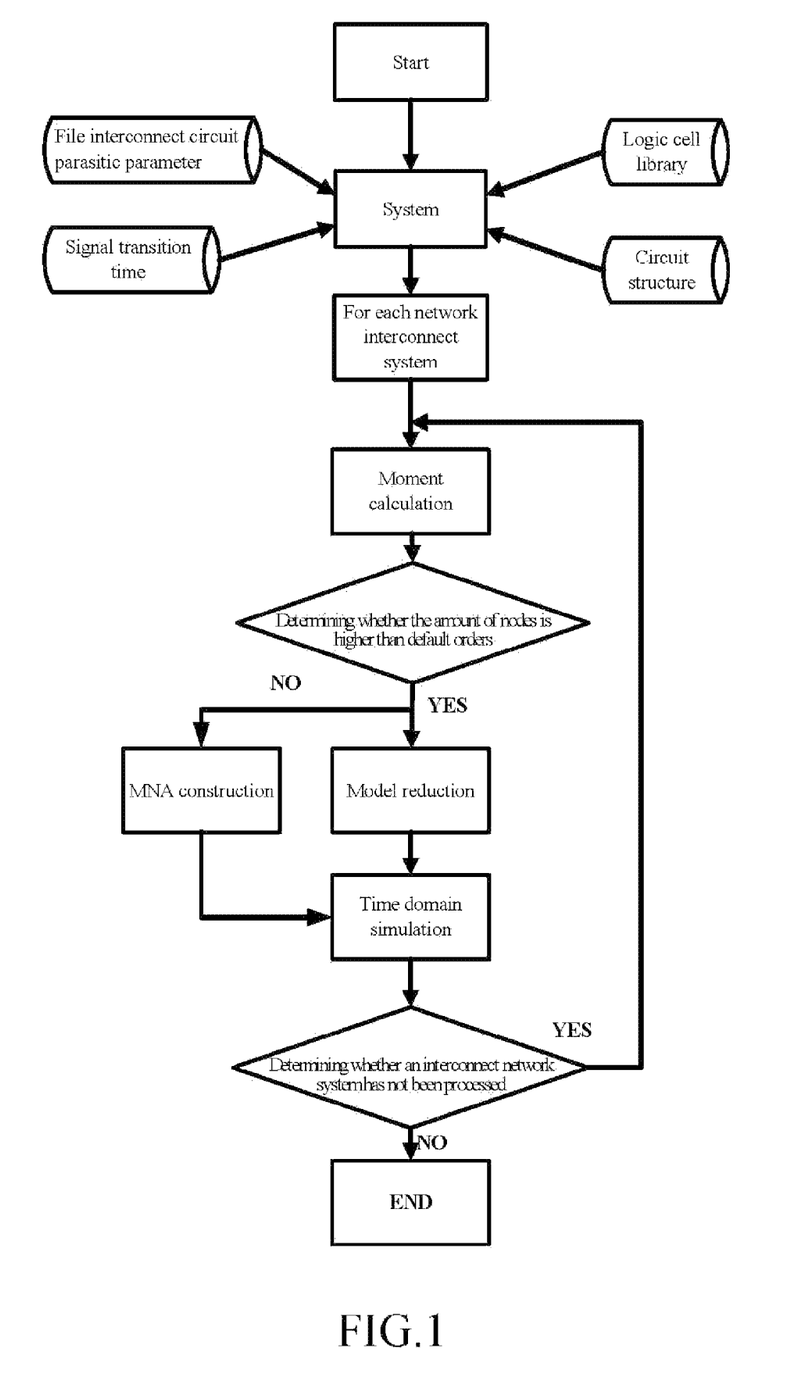
FIG. 1 is a flow chart of this invention.

A method of estimating the signal delay in a VLSI circuit is provided in this invention, as shown in FIG. 1, in which at the step of Start, a file interconnect circuit parasitic parameter, a signal conversion time, a logic cell library, and a circuit structure are inputted to a file data read system.

For each network interconnection system, the structure of a specific target interconnection circuit is analyzed, and the system moment of the specified system is calculated. The calculation of moment is made for the voltage moment of each node and for the current moment of a branch line, which may be applied to the calculation of equivalent capacitance and the construction of a projection matrix. In the recursion moment operation, the circuit moment of each node in the circuit may be obtained in linear time, and, thus, the projection matrix is further constructed.

In the process of construction of the reduced model, it is determined whether the amount of nodes in the specified system is higher than a default order. When the specified order exceeds the default order, the system is significantly complicated. Due to the special structure of a tree network, this invention may be applied to a sparse matrix to store the circuit parameter of the original system, which significantly reduces the resource of operation. Sparse matrix multiplication is applied to obtain a final reduced model for analysis of the signal time domain simulation. The reduced model stays passive and stable, and the operation condition of its input and output node is identical to that of the original system.

Contrarily, when the order of the target interconnect circuit is less than a default order, a Modified Nodal Analysis matrix system is constructed directly corresponding to a Modified Nodal Analysis matrix system that represents its current and voltage behavior pattern for analysis of the time domain simulation.

At the step of analysis of the time domain simulation, the equivalent capacitance loaded by a drive element is first calculated, and a table look-up is applied to get an output signal of an input interconnect circuit structure.

By analysis of the time domain simulation, the time domain simulation is made for the Modified Nodal Analysis matrix system and is then off analyzed for drive logic gate delay time, interconnection circuit delay time, and output signal conversion time.

Determination is made whether a network interconnection system has not yet been processed. If a system has not yet been processed, the step of determining the interconnect circuit structure returns for analysis of a next interconnect circuit signal. If all of the interconnect circuits has been off processed, an end of estimation of the system delay of this invention takes place.

The algorithm applied to this invention comprises the techniques of moment calculation, model reduction, recursion moment operation, time domain analysis, and equivalent capacitance operation, which will be described in detail.

Moment Calculation

Figure 2:
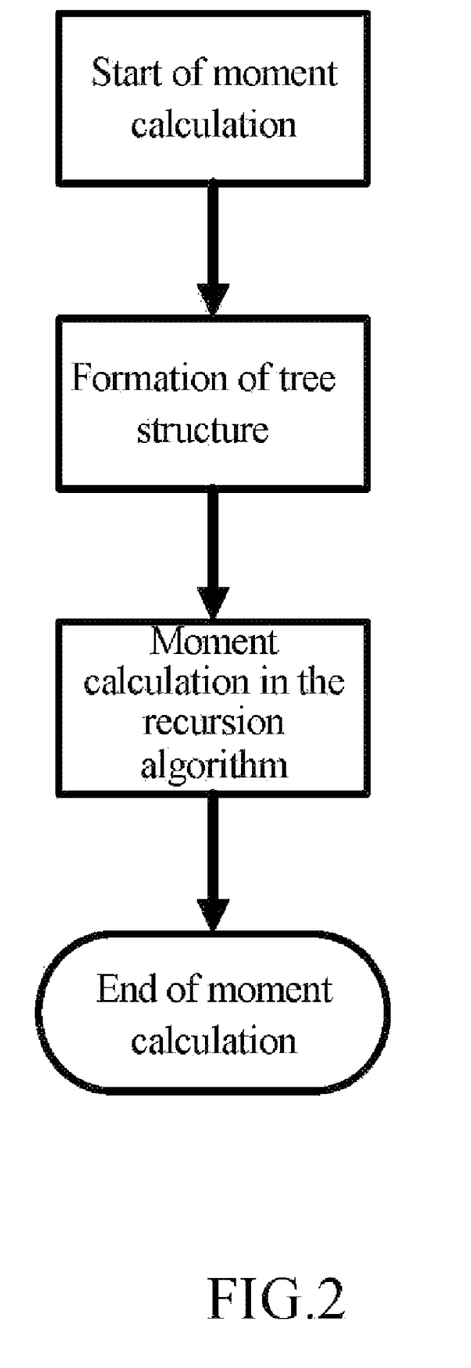
FIG. 2 is a flow chart of a technique of recursion moment operation of this invention.

FIG. 2 illustrates a flow of calculation of voltage moment of each node and current moment of each branch line. At the step of Start, calculation must be done for the voltage moment and the current moment. For a RC interconnect circuit, a tree connection structure may be formed, in which each branch is resistance and each node is ground capacitance, both of which are calculated for the (voltage and current) moment by the recursion algorithm.

In this invention, calculation is done from the default order for the voltage moment of each node and for O(kn), the complexity of operation, in which k is the order of the reduced system and n is the number of the node, making the moment calculation (flow) end.

Recursion Moment Operation

In the technique of model reduction, the Arnoldi iteration algorithm and PVL iteration algorithm are conventionally used to construct the projection matrix. Matrix multiplication is included in the iteration process, so the complexity of operation of a large system increases. In FIG. 2 according to this invention, the recursion algorithm is applied for moment calculation in order to speed up the execution of a program. The formula of the current and voltage moment between the nodes that is given for moment by the recursion algorithm may be expressed as:

$$I_{j,k} = I_{C_{j,k}} - \sum_{n_x^i \in S(n_j^i)} I_{x,k} \text{ and } V_{j,k} = V_{F(j),k} - R_j I_{j,k} \quad (1)$$

where $I_{j,k}$ indicates the moment of current j in order k, $I_{C_{j,k}}$ is the capacitive current related to node j, $$\sum_{n_x^i \in S(n_j^i)} I_{x,k}$$

is the total of the moment of current flowing out of node j, $V_{j,k}$ is the moment at node j in order k, and $V_{F(j),k}$ is the moment of voltage at a father node of node j.

Model Reduction

Figure 3:
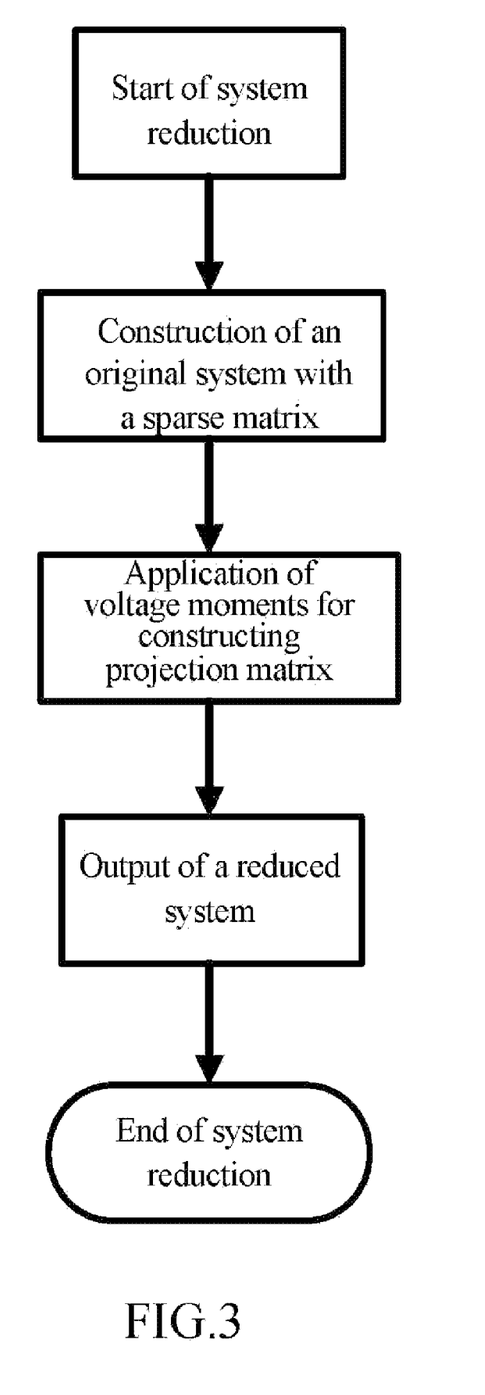
FIG. 3 is a flow chart of a technique of model reduction.

The model order of the interconnect VLSI circuit is quite huge. In order to reduce the complexity of system operation, the technique of model reduction is applied for a next step of simulation and analysis, in which the flow of model reduction is shown in FIG. 3.

First, regarding the analysis of interconnect circuit, Kirchhoff's current law is applied to give the following equation;

$$\left( s \underbrace{\begin{bmatrix} C_1 & 0 \\ 0 & C_2 \end{bmatrix}}_{M} + \underbrace{\begin{bmatrix} G_1 & -G_1 \\ -G_2 & G_2 \end{bmatrix}}_{N} \right) \underbrace{\begin{bmatrix} V_1(s) \\ V_2(s) \end{bmatrix}}_{X(s)} = bV_s(s), \quad Y(s) = c^T X(s) \quad (2)$$

where $X(s) \in R^n$ is a state vector, $V_s(s) \in R^m$ is an input vector, $Y(s) \in R^p$ is an output vector, and $M, N \in R^{n \times n}$, $b \in R^{n \times m}$, $c \in R^{n \times p}$ are so-called MNA matrices, in which M and N matrix comprises a capacitor C and a conductance G. It is a Positive Definite matrix, M is a symmetric matrix, and N is an asymmetric matrix. n is the entries of nodes in the interconnect circuit. When the order of interconnect circuit is higher, the size of a matrix increases, with a great deal of memory data being wasted. When the system reduction (flow) starts, in which the special structure of RC circuit is considered in this invention, the sparse matrix is used to form an original system. The technique of sparse matrix is applied to store the data regarding the capacitance and resistance, thereby the system resource is significantly reduced. In order to form an equivalent reduced system, the voltage moment that is used to establish the projection matrix (as shown in FIG. 2 illustrating the recursion moment) is applied to form a low-order system:

$$\hat{N} = Q^T N Q, \hat{M} = Q^T M Q, \hat{b} = Q^T b, \text{ and } \hat{c} = Q^T c \quad (3)$$

where the projection matrix Q is given to form the voltage moment of order k in formula (1). After the projection, an output reduced system of the original system is obtained and may be made to stay passive and stable. Finally, the system reduction ends.

Time Domain Simulation

Figure 4:
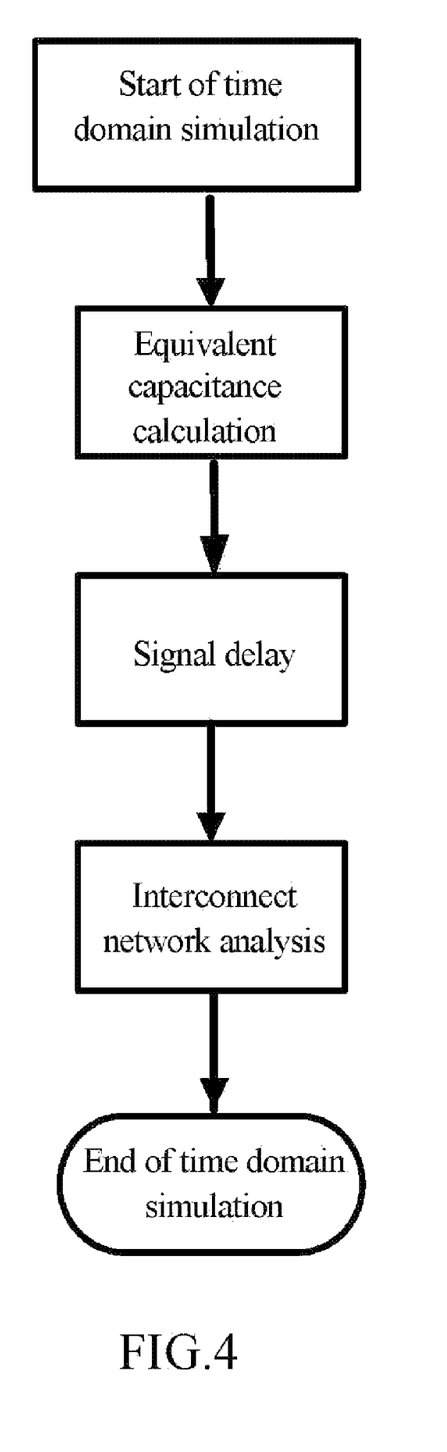
FIG. 4 is a flow chart of time domain simulation.

FIG. 4 illustrates a time domain simulation starting from time domain simulation 150 for an equivalent capacitance. The time domain simulation analyzes clocks in the circuit, in which the flow may be divided into two parts.

For the first part of the signal delay, calculation is done for the delay of input signal passing through a drive element. This program makes use of the table look-up of a logic cell library to obtain such information. The method of table look-up is applied for the information on input signal conversion time and output load, thereby the signal delay and the output signal conversion time is obtained.

For the second part of the interconnect circuit analysis on the delay and conversion time of output signal passing through the interconnect circuit, the operation condition after calculation of the signal passing though the interconnect circuit is applied for the reduced model given in the technique of model reduction. A moment equation is solved for an output result, in which an ordinary moment equation may be expressed as:

$$M\dot{x} + Nx = bV_s \quad (4)$$

where the time domain simulation is made to end.

Equivalent Capacitance Calculation

Figure 5:
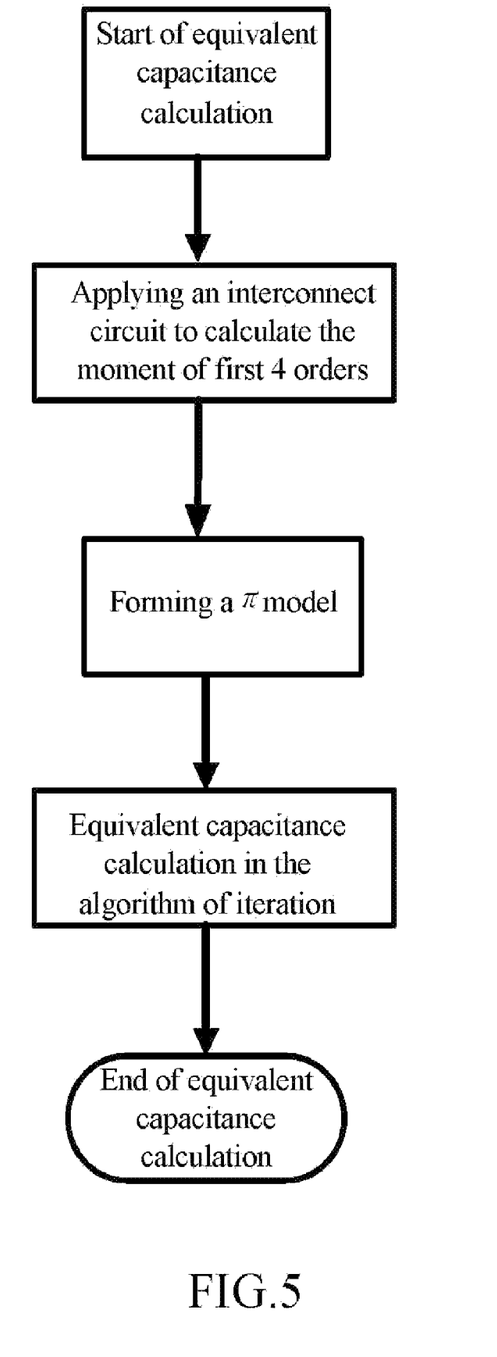
FIG. 5 is a flow chart of calculation of equivalent capacitance.

Regarding the manner of table look-up for the algorithm of time domain simulation, the pieces of input information are the input signal transition time and the output load. Because the load connected to the drive element is an RC interconnect circuit, in order to obtain an equivalent capacitive load, a technique of calculating the equivalent capacitance is used to obtain an accurate output signal.

As shown in FIG. 5 illustrating a flow of equivalent capacitance calculation, calculation of the equivalent capacitance starts. At the time of equivalent capacitance calculation, for a large interconnect RC circuit, the interconnect circuit is used to calculate the moment of first 4 orders, a π (equivalent) model is formed, and the manner of iteration is used to calculate equivalent capacitance. Thereby, the equivalent capacitance is obtained, and the equivalent capacitance calculation is made to end.

Figure 6A:
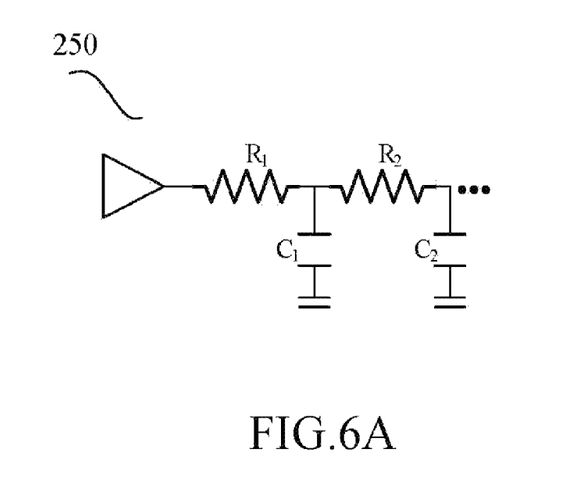
FIG. 6a is a view of an original RC circuit.
Figure 6B:
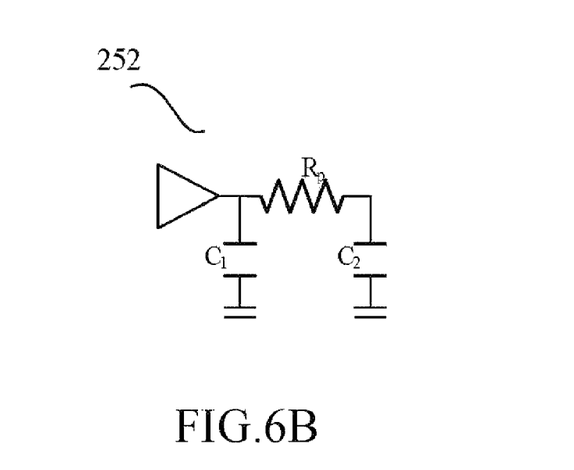
FIG. 6b is a view of a structured equivalent model.
Figure 6C:
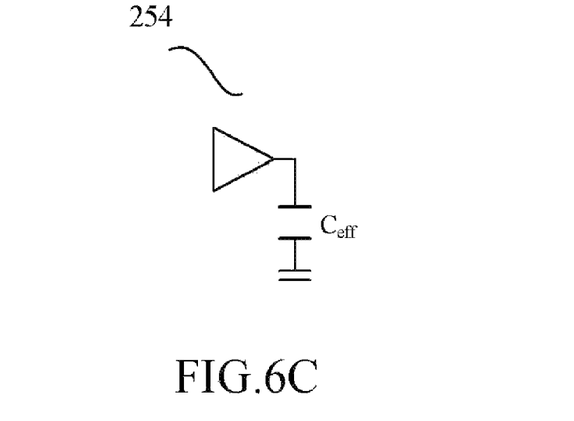
FIG. 6c is a view of an equivalent circuit.

The structure of equivalent model, as shown in FIGS. 6a through 6c, is an original RC circuit system 250. In this invention, calculation is done for the former 2 orders of voltage moment and the former 3 orders of current moment that are at the Root of the RC interconnect circuit. A technique of moment matching is applied to obtain three parameters $C_1$, $C_1$, and $C_1$ 252 of the π model, and in case of:

$$\frac{i_{root}}{v_{root}} = \frac{a_0 + sa_1 + s^2 a_2}{1 + sb_1} \quad (5)$$

$$\text{then } c_1 = \frac{a_1}{b_1}, \quad c_2 = a_1 - \frac{a_2}{b_1}, \text{ and } R_\pi = \frac{b_1^2}{b_1 a_1 - a_2}.$$

Finally, it is reduced to equivalent capacitance 254.

Regarding the analysis on the operation complexity, for example of a huge interconnect RC circuit, there are two parts in this algorithm, namely model reduction and time domain analysis. This algorithm lets n be the entries of nodes of the original system and k be the reduced order. In the technique of model reduction, the skill of recursion moment is applied to obtain the projection matrix. The complexity is $O(nk)$, and at the step of model reduction fulfilled by the skill of congruent projection, the original system MN may represent a type of sparse matrix, so the complexity is $O(nk^2)$ and $O(k^2)$ for the matrix operation of the educed system. Thus, by all accounts, the complexity of operation is $O(nk+nk^2+k^2)$, and $k<<n$.

SIMPLE EMBODIMENT

Figure 7:
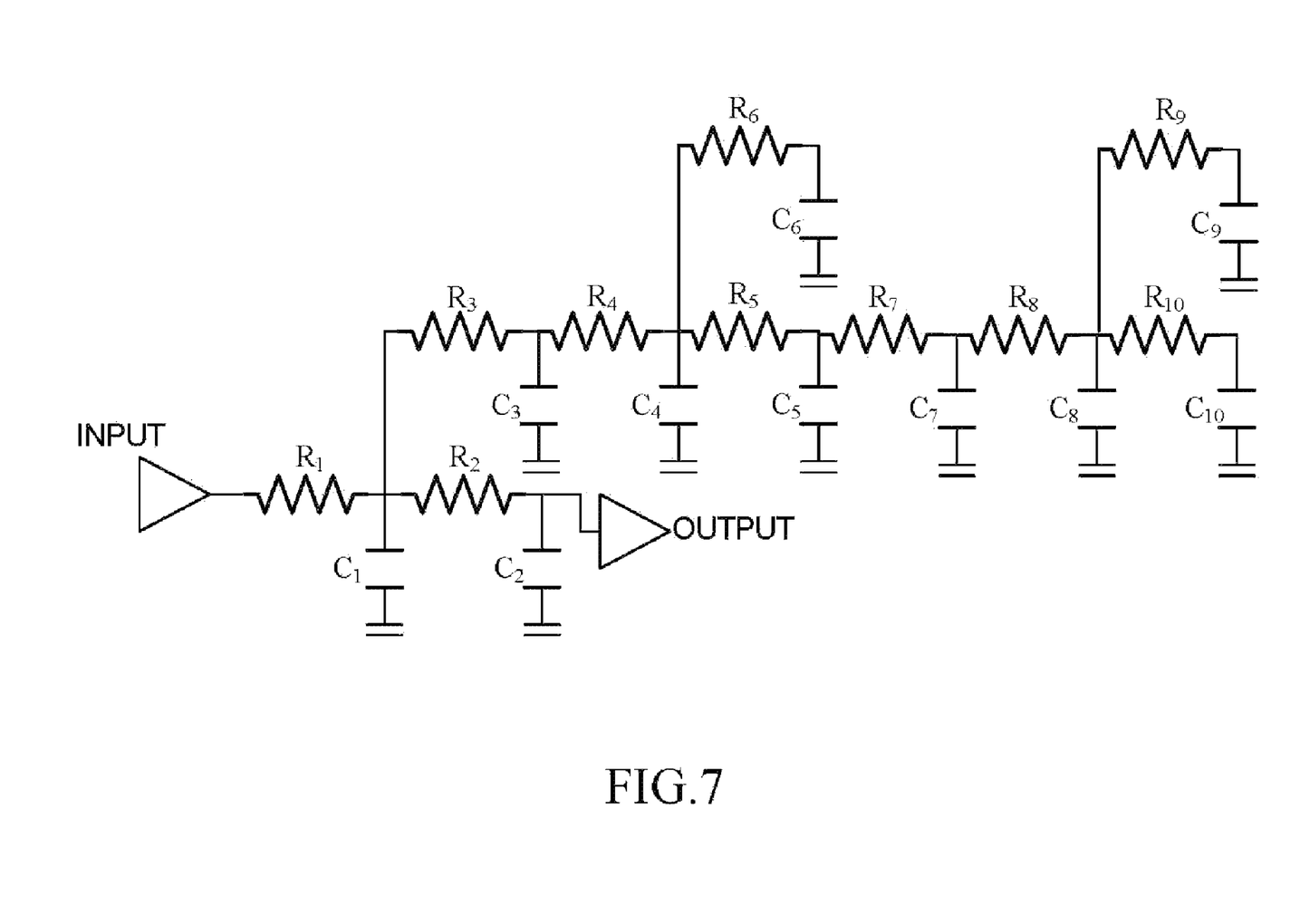
FIG. 7 is a view of the validity of an algorithm in this invention.

In order to prove the accuracy of the algorithm in this invention, as shown in FIG. 7, a circuit model (Case 1) with 10 nodes is provided and applied to analyze the performance of algorithm. However, the application of this application is not limited to the structure only.

(Case 1) consists of 10 resistors and 10 capacitors, of which the parameters are 100Ω and 0.01 pF, respectively. Standard error margin discussion is made through the waveform of the input signal from the original circuit of this testing circuit and through the calculation in the technique of model reduction and the analysis on the output result. The result obtained from the calculation by the Golden SPICE software, in which Golden is the standard that is used in the industry and SPICE is a kind of software on language and simulation that is used in circuit description and simulation to detect the connection of circuits and the integrity of functions and to predict the behavior of a circuit. It is mainly used for the simulation of a simulated circuit and a mixed signal circuit. The drive logic cell delay error is defined to:

$$\left(\frac{\text{cell delay of the SPICE} - \text{cell delay of the invention}}{\text{delay of the SPICE}}\right) * 100\% \quad (6)$$

The output signal delay error of the interconnect wire is defined to:

$$\left(\frac{\text{wire delay of the SPICE} - \text{wire delay of the invention}}{\text{delay of the SPICE}}\right) * 100\% \quad (7)$$

The output signal transition error of the interconnect wire is defined to:

$$\left(\frac{\text{wire transition of the SPICE} - \text{wire transition of the invention}}{\text{wire transition of the SPICE}}\right) * 100\% \quad (8)$$

Five columns in Table 1 give respectively: (1) comparison between the error of cell delay and that of golden SPICE, (2) comparison between the error of wire delay and that of golden SPICE, (3) comparison between the error of wire transition and that of golden SPICE, (4) time spent for calculation, and (5) memory occupied for execution.

| Case | cell delay | wire delay | wire transition | Time spent for calculation | Occupied memory size during execution |
|---|---|---|---|---|---|
| 1 | 0.74% | 0.98% | 0.90% | Less than 1 s | 254 KB |
| 2 | 0.51% | 0.82% | 0.88% | 0.04 s | 2736 KB |
| 3 | 0.89% | 0.74% | 0.83% | 0.07 s | 3176 KB |
| 4 | 1.22% | 1.18% | 1.33% | 4.66 s | 8 MB |
| Average | 0.84% | 0.93% | 0.98% | Less than 1 s | 4 MB |

Through the calculation for a mean error given in Table 1 by the comparison between the result obtained in the technique proposed in the present invention and that obtained by the Golden SPICE software, the accuracy of this invention is apparent. The algorithm in this invention is achieved by Ansi C, compiled by gcc in a Uxix system, and executed on the platform of SUN Blade 2000 with a memory of 2 GB.

Case2 consists of five interconnect systems, amounting to 5 resistors and 15 capacitors.

Case3 consists of ten interconnect systems, amounting to 178 resistors and 170 capacitors.

Case4 consists of six interconnect systems, amounting to 6000 resistors and 6000 capacitors.

Case2~Case4 separately consists of a plurality of interconnect systems. The values of resistance and capacitance vary with the interconnect systems in each different Case for achievement of an analysis of extensive testing and real performance.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of estimating signal delay in a VLSI circuit, comprising:

inputting a file interconnect circuit parasitic parameter, a signal transition time, a logic cell library, and a circuit structure of an original system to a file data read system; for each network interconnect system, analyzing structure of a specific target interconnect circuit and calculating a system moment of the specific target interconnect circuit which is applied to calculation of an equivalent capacitance and construction of a projection matrix; in recursion moment operation, a circuit moment of each node in the specific target interconnect circuit being obtained in linear time, and the projection matrix being further constructed;

in construction of a reduced model, determining whether an amount of nodes in the specific target interconnect circuit is higher than a default order; when higher than the default order, applying a sparse matrix to store the file interconnect parasitic circuit parameter of the original system; and applying sparse matrix multiplication to obtain a final reduced model for analysis of a signal time domain that is simulated by a simulation system; with the final reduced model staying passive and stable and having an operation condition of input and output nodes identical to that of the original system;

contrarily, when less than the default order, constructing a Modified Nodal Analysis matrix system directly corresponding to a Modified Nodal Analysis matrix system representing a current and voltage behavior pattern for analysis of the time domain simulation;

with the analysis of the signal time domain simulation, calculating an equivalent capacitance loaded by a drive element and applying a table look-up to obtain an output signal of an input interconnect circuit structure;

with the analysis of the signal time domain simulation, making a time domain simulation for the Modified Nodal Analysis matrix system and then off analyzing for a drive logic gate delay time, an interconnection circuit delay time, and a output signal conversion time; and determining whether a interconnect network system has not been processed; if yes, returning the structure of the specific target interconnect circuit to analyze a next signal from an interconnect circuit; and if not, making final the system delay estimation.

2. The method of estimating the signal delay in the VLSI circuit according to claim 1, wherein when calculation begins for voltage moment and current moment, forming the specific target interconnect circuit into a tree structure, in which each branch is a resistor and each node is a grounded capacitor, and calculating in a recursion algorithm for the voltage moment and the current moment and from the default order for the voltage moment of each node and the current moment of each branch, wherein O(kn) is the complexity of operation, in which k is the order of the final reduced model and n is the number of the node, and making the moment calculation (flow) end.

3. The method of estimating the signal delay in the VLSI circuit according to claim 2, wherein analysis of the signal time domain simulation starts calculation of the equivalent capacitance, and anaylzes clocks in the original circuit, and is divided into first and second parts;

for the first part, calculation being done for the delay of input signal passing through the drive element applying the table look-up of the logic cell library on an input signal conversion time and output load to obtain a signal delay and an output signal conversion time;

for the second part through an output signal delay and signal transition time after circuit interconnection, applying operation conditions along with the reduced model resulting in an output result obtained after solution of a moment equation, thereby making final a time domain simulation.

4. The method of estimating the signal delay in the VLSI circuit according to claim 3, wherein at the equivalent capacitance calculation, the specific target interconnect circuit is used to calculate the moment of first 4 orders, a $\pi$ equivalent model is formed, and a manner of iteration is used to calculate the equivalent capacitance, thereby a final equivalent capacitance is obtained, and the equivalent capacitance calculation is made to end.

* * * * *